(12) United States Patent
Kim et al.

(10) Patent No.: US 7,065,898 B2
(45) Date of Patent: Jun. 27, 2006

(54) MODULE FOR TRANSFERRING A SUBSTRATE

(75) Inventors: Hyun-Joon Kim, Anyang (KR); Yo-Han Ahn, Yongin (KR); Dong-Seok Ham, Suwon (KR); Jae-Bong Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 313 days.

(21) Appl. No.: 10/763,203

(22) Filed: Jan. 26, 2004

(65) Prior Publication Data

US 2004/0168742 A1 Sep. 2, 2004

(30) Foreign Application Priority Data

Feb. 12, 2003 (KR) .................. 10-2003-0008847

(51) Int. Cl.
*F26B 21/06* (2006.01)
(52) U.S. Cl. ....................................... 34/78
(58) Field of Classification Search ............ 34/77, 34/78, 80; 118/668, 319
See application file for complete search history.

(56) References Cited

U.S. PATENT DOCUMENTS 6,041,819 A * 3/2000 Walleman ............... 137/625.5
6,146,468 A * 11/2000 Dryer et al. ............... 134/10
6,224,679 B1    5/2001 Sasaki et al.
6,364,762 B1    4/2002 Kaveh et al.
6,497,734 B1 * 12/2002 Barber et al. ............ 29/25.01
6,610,123 B1 *  8/2003 Wu et al. ................. 95/69
6,797,617 B1 *  9/2004 Pomarede et al. ......... 438/680

FOREIGN PATENT DOCUMENTS

KR    10-2004-0047303    6/2004

* cited by examiner

*Primary Examiner*—S. Gravini
(74) *Attorney, Agent, or Firm*—Lee & Morse, P.C.

(57) ABSTRACT

A module for transferring a substrate includes a load port for supporting a container to receive a plurality of substrates, a substrate transfer chamber disposed between the load port and a substrate process module, a substrate transfer robot disposed in the substrate transfer chamber for transferring the substrates between the container and the substrate process module, a gas supply unit connected to the substrate transfer chamber for supplying a purge gas into the substrate transfer chamber to purge an interior of the substrate transfer chamber, and a contamination control unit connected to the substrate transfer chamber for circulating the purge gas supplied into the substrate transfer chamber, resupplying the circulated purge gas into the substrate transfer chamber and removing particles and airborne molecular contaminants from the purge gas being circulated. Contamination of a substrate may be prevented and a necessary amount of purge gas may be reduced.

22 Claims, 4 Drawing Sheets

MODULE FOR TRANSFERRING A SUBSTRATE

BACKGROUND OF THE INVENTION

1. Field of the Invention

The present invention is related to a module for transferring a substrate. More particularly, the present invention is related to a module for transferring a substrate between a container to receive a plurality of substrates and a module for processing the substrate.

2. Description of the Related Art

Generally, semiconductor devices are manufactured through a three-step process. First, a fabrication process is performed for forming electronic circuits on a silicon wafer used as a semiconductor substrate. Second, an electrical die sorting (EDS) process is performed for inspecting electrical characteristics of the semiconductor devices on the semiconductor substrate. Third, a packaging process is performed for packaging the semiconductor devices in epoxy resins and individuating the semiconductor devices.

The fabrication process may include a deposition process for depositing a layer on the substrate, a chemical mechanical polishing (CMP) process for planarizing a surface of the layer, a photolithography process for forming a photoresist pattern on the layer, an etching process for an electrical pattern using the photoresist pattern, an ion implantation process for implanting predetermined ions into predetermined portions of the substrate, a cleaning process for removing impurities from the substrate, an inspection process for inspecting the surface of the substrate on which the layer or the pattern is formed, or other similar processes.

These processes are performed under a high vacuum condition in order to prevent contamination of the semiconductor substrate. To provide the high vacuum condition, a substrate process apparatus includes a load lock chamber maintained under a low vacuum condition, a process chamber in which the process is performed, and a substrate transfer chamber for transferring the semiconductor substrate between the load lock chamber and the process chamber.

Recently, a substrate process apparatus for some processes (for example, a deposition process or a dry etching process) on a 300 mm semiconductor substrate includes a substrate process module, a substrate transfer module and a load lock chamber. The substrate transfer module includes a load port for supporting a front opening unified pod (FOUP), a substrate transfer chamber disposed between the load port and the load lock chamber, and a substrate transfer robot for transferring the semiconductor substrate between the FOUP and the load lock chamber.

A fan filter unit (FFU) is connected to an upper portion of the substrate transfer chamber. The fan filter unit supplies an interior of the substrate transfer chamber with clean air for preventing contamination of the semiconductor substrate being transferred by the substrate transfer robot.

A plurality of exhaust holes is formed through a bottom panel of the substrate transfer chamber in order to exhaust the clean air supplied from the fan filter unit out of the substrate transfer chamber or to a clean room in which the substrate process apparatus is provided.

When an internal pressure of the substrate transfer chamber is lower than a pressure of the clean room, the air in the clean room may flow back into the substrate transfer chamber, so that the semiconductor substrates received in the FOUP and the semiconductor substrate being transferred by the substrate transfer robot may be contaminated. Therefore, it is preferable to maintain the internal pressure of the substrate transfer chamber higher than the pressure of the clean room. The pressure of the clean room, in which the substrate process apparatus is provided, is generally a positive pressure (i.e., higher than atmospheric pressure).

For example, a multichamber processing system including a container-housing chamber, a cleaning chamber and a load lock chamber is disclosed in the prior art. The cleaning chamber has an inlet line for introducing a clean gas into the cleaning chamber and a pressure control device for controlling the pressure in the cleaning chamber. The pressure control device includes a valve for adjusting a flow rate of the gas in the inlet line, a differential pressure gauge for detecting a differential pressure between the pressure in the cleaning chamber and the atmospheric pressure, and a valve controller for adjusting an opening degree of the valve so that the pressure in the cleaning chamber is maintained at the positive pressure based on a result of the detecting by the differential pressure gauge.

In addition, wafer atmospheric transport module having a controlled mini-environment is disclosed in the prior art. According to this example, a blower located in the top region of an enclosed housing is configured to generate a flow of air downward. The airflow generated by the blower is restricted from freely flowing through a perforated sheet and is partially induced to be redirected toward the shelf, and a cassette having one or more wafers is configured to sit on a shelf in the enclosed housing and thus be subjected to the redirected air flow.

The fan filter unit includes a fan for supplying external air into the substrate transfer chamber and a filter for removing particles contained in the external air being supplied into the substrate transfer chamber. However, the filter cannot remove airborne molecular contaminants, such as organic contaminants, contained in the external air being supplied into the substrate transfer chamber. Such airborne molecular contaminants may cause various defects on the semiconductor substrate.

Examples of the defects may include a variation of a critical dimension (CD) of a photochemical amplified resist pattern and T-top defect caused by ammonia, a natural oxide layer generated by ozone, condensational contaminants or the like. Variation of the critical dimension of the photochemical amplified resist pattern and T-top defect may be detected in the fabrication process, and operation failure of electrical circuit elements such as transistors due to organic contaminants such as dioctyl phthalate (DOP) may be detected in the electrical die sorting process.

SUMMARY OF THE INVENTION

To solve these and other problems, the present invention provides a module for transferring a substrate that prevents the substrate from being contaminated by impurities including particles and airborne molecular contaminants during transfer of the substrate between a FOUP and a substrate process module.

According to a feature of an embodiment of the present invention, there is provides a module for transferring a substrate including a load port for supporting a container to receive a plurality of substrates, a substrate transfer chamber disposed between the load port and a substrate process module for processing the substrates, a substrate transfer robot disposed in the substrate transfer chamber for transferring the substrates between the container and the substrate process module, a gas supply unit connected to the substrate transfer chamber for supplying a purge gas into the substrate transfer chamber so as to purge an interior of the substrate transfer chamber, and a contamination control unit connected to the substrate transfer chamber for circulating the purge gas supplied into the substrate transfer chamber, resupplying the circulated purge gas into the substrate transfer chamber and removing particles and airborne molecular contaminants from the purge gas being circulated.

In the module, the container preferably includes a front opening unified pod (FOUP). The module may further include a door opener for opening and closing a door of the FOUP. Also in the module, the gas supply unit may include a gas source for providing the purge gas, a gas supply pipe for connecting the gas source and the substrate transfer chamber, and a flow controller installed in the gas supply pipe for adjusting a flow rate of the purge gas being supplied into the substrate transfer chamber.

The purge gas may include a nitrogen gas, and the gas source may include a storage container for storing the nitrogen gas and a purifier for purifying the nitrogen gas. Alternatively, the purge gas may include air, and the gas source may include a storage container for storing compressed air and a purifier for removing impurities contained in the air being supplied from the storage container. The purifier preferably includes a molecular sieve purifier or a catalytic purifier.

The contamination control unit may include a gas circular pipe connecting an upper portion and a lower portion of the substrate transfer chamber, an air pump installed in the gas circular pipe for sucking the purge gas supplied into the substrate transfer chamber and circulating the sucked purge gas through the gas circular pipe, a filtering part installed in the gas circular pipe for removing the particles and the airborne molecular contaminants contained in the purge gas being circulated, and a flow controller installed in the gas circular pipe for controlling a flow rate of the purge gas being circulated.

The contamination control unit may further include a gas exhaust pipe connected to the gas circular pipe for exhausting the purge gas being circulated and a valve installed in the gas exhaust pipe for opening and closing the gas exhaust pipe.

The contamination control unit may further include a valve installed in the gas circular pipe between the lower portion of the substrate transfer chamber and the air pump for opening and closing the gas circular pipe.

The filtering part may include a particle filter for removing the particles contained in the purge gas being circulated, a moisture purifier for removing moisture contained in the purge gas being circulated, and an organic contaminant filter for removing organic contaminants contained in the purge gas being circulated. The moisture purifier is preferably a molecular sieve moisture purifier; the organic contaminant filter is preferably an activated carbon filter.

The module may further include a distribution panel horizontally disposed in the substrate transfer chamber, the distribution panel having a plurality of holes for uniformly supplying the purge gas into the substrate transfer chamber, and a particle filter disposed between the distribution panel and the substrate transfer robot for removing particles contained in the purge gas being supplied through the holes of the distribution panel.

Also, an ionizer may be disposed between the distribution panel and the particle filter for removing static electricity from the substrates.

The purge gas may be an inert gas, and the inert gas may be a nitrogen gas. Alternatively, the purge gas may be purified air.

A photo catalyst filter may be disposed between the distribution panel and the particle filter for removing organic contaminants contained in the purge gas being supplied into the substrate transfer chamber, and an ultraviolet lamp for applying ultraviolet rays onto the photo catalyst filter. An ozone filter may be disposed between the photo catalyst filter and the particle filter for removing ozone contained in the purge gas being supplied into the substrate transfer chamber.

A differential pressure sensor may be connected to the substrate transfer chamber for measuring a differential pressure between an internal pressure and an external pressure of the substrate transfer chamber and a control unit for comparing the differential pressure measured by the differential pressure sensor with a predetermined differential pressure, and for adjusting a flow rate of the purge gas being supplied into the substrate transfer chamber and a flow rate of the purge gas being circulated through the contamination control unit in accordance with a comparison result.

A perforated panel may be disposed above a bottom panel of the substrate transfer chamber for passing the purge gas supplied into the substrate transfer chamber therethrough, wherein the perforated panel has a plurality of holes, and the contamination control unit is connected to the bottom panel of the substrate transfer chamber.

The interior of the substrate transfer chamber is purged by the purge gas supplied from the gas supply unit and the resupplied purge gas from the contamination control unit, and thus impurities including particles and airborne molecular contaminants do not flow into the substrate transfer chamber. As a result, contamination of the substrate due to the impurities may be prevented.

In addition, the purge gas supplied into the substrate transfer chamber is circulated by means of the contamination control unit, and thus an amount of the purge gas used in the substrate transfer module may be reduced.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2003-8847, filed on Feb. 12, 2003, and entitled: "Module For Transferring A Substrate," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
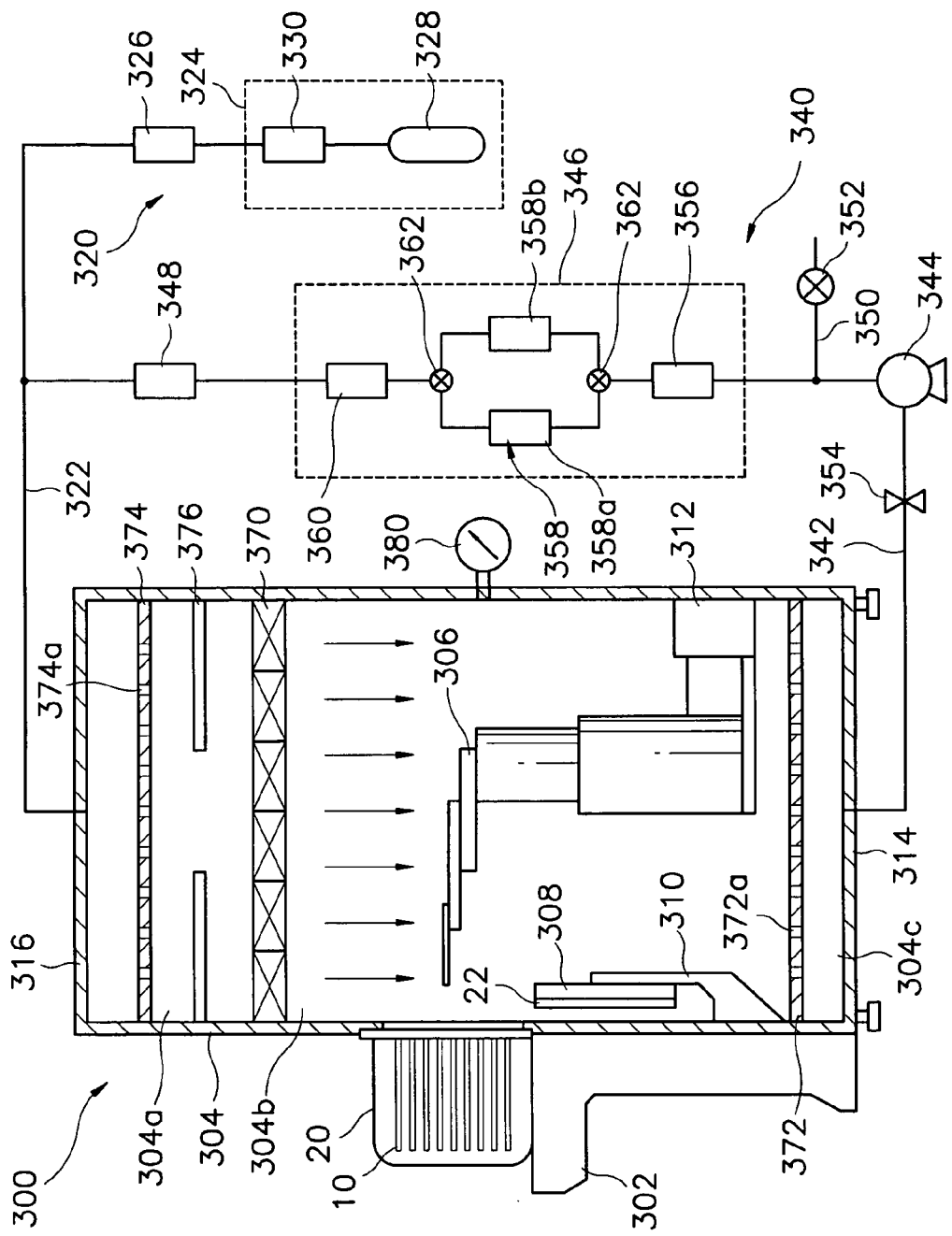
FIG. 1 illustrates a cross-sectional view of a module for transferring a substrate according to one embodiment of the present invention.
Figure 2:
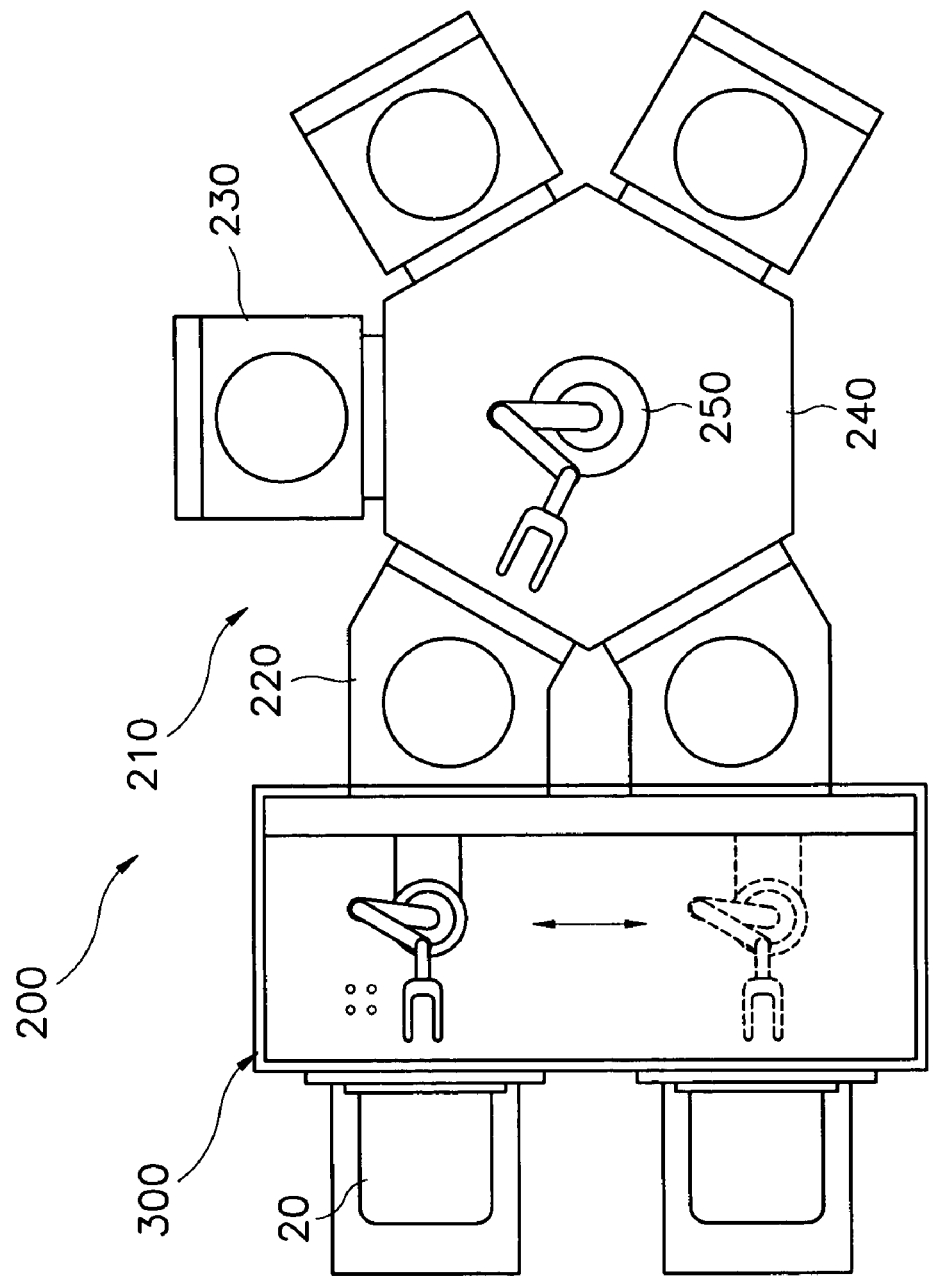
FIG. 2 illustrates a plan view of a substrate process apparatus having the substrate transfer module as shown in FIG. 1.

FIG. 1 illustrates a cross-sectional view of a module for transferring a substrate according to one embodiment of the present invention, and FIG. 2 illustrates a plan view of a substrate process apparatus having the substrate transfer module as shown in FIG. 1.

Referring to FIGS. 1 and 2, a substrate process apparatus 200 performs some processes, for example, a deposition process for forming a layer on a semiconductor substrate 10 or an etching process for etching the layer on the semiconductor substrate 10 to form an electrical pattern on the semiconductor substrate 10. The substrate process apparatus 200 preferably includes a substrate process module 210 for processing the semiconductor substrate 10, and a substrate transfer module 300 for transferring the semiconductor substrate 10 between a container for receiving a plurality of semiconductor substrates 10 and the substrate process module 210. The container preferably includes a front opening unified pod (FOUP) 20.

A pair of load lock chambers 220 is disposed between the substrate process module 210 and the substrate transfer module 300.

The substrate process module 210 preferably includes a plurality of process chambers 230 for processing the semiconductor substrates 10, a first substrate transfer chamber 240 for connecting between the load lock chambers 220 and the process chambers 230, and a first substrate transfer robot 250 for transferring the semiconductor substrates 10 between the load lock chambers 220 and the process chambers 230.

The substrate transfer module 300 preferably includes a load port 302 for supporting the FOUP 20, a second substrate transfer chamber 304 disposed between the load port 302 and the load lock chambers 220, a second substrate transfer robot 306 for transferring the semiconductor substrates 10 between the FOUP 20 and the load lock chambers 220, a gas supply unit 320 for supplying a purge gas into the second substrate transfer chamber 304 in order to purge an interior of the second substrate transfer chamber 304, and a contamination control unit 340 for preventing contamination of the semiconductor substrates 10.

Although not shown in detail, the load port 302 supports the FOUP 20 and brings a door 22 of the FOUP 20 into tight contact with a door 308 of the second substrate transfer chamber 304. A door opener 310 for opening and closing the door 22 of the FOUP 20 is provided in the second substrate transfer chamber 304 and is connected to the door 308 of the second substrate transfer chamber 304. The door opener 310 simultaneously opens the door 22 of the FOUP 20 and the door 308 of the second substrate transfer chamber 304.

The second substrate transfer robot 306 is disposed to transfer the semiconductor substrates 10 in the second substrate transfer chamber 304. A driving part 312 for moving the second substrate transfer robot 306 horizontally is installed on an inner sidewall of the second substrate transfer chamber 304, and the second substrate transfer robot 306 is connected to the driving part 312. However, the second substrate transfer robot 306 may be installed on a bottom panel 314 of the second substrate transfer chamber 304. That is, although the second substrate transfer robot 306 shown in FIG. 1 is connected to the driving part 312, numerous other configurations are possible.

The gas supply unit 320 is connected to an upper panel 316 of the second substrate transfer chamber 304. The gas supply unit 320 preferably includes a gas supply pipe 322 connected to the upper panel 316, a gas source 324 for supplying the purge gas, and a first flow controller 326 for adjusting a flow rate of the purge gas supplied from the gas source 324.

A mass flow controller (MFC) may be used as the first flow controller 326, and an inert gas such as nitrogen gas, argon gas or the like may be used as the purge gas.

The gas supply unit 320 preferably supplies the purge gas into the second substrate transfer chamber 304, and the gas source 324 preferably includes a storage container 328 for storing the purge gas and a gas purifier 330 for purifying the purge gas. It is preferable that an oxygen content and a water content of nitrogen gas used as the purge gas are less than about 10 ppb. Examples of the gas purifier 330 may include an area purifier, a bulk purifier or the like.

The contamination control unit 340 connected to the second substrate transfer chamber 304 circulates the purge gas supplied into the second substrate transfer chamber 304, resupplies the circulated purge gas into the second substrate transfer chamber 304, and removes particles and airborne molecular contaminants contained in the purge gas being circulated.

The contamination control unit 340 preferably includes a gas circular pipe 342, an air pump 344, a filtering part 346, and a second flow controller 348. The gas circular pipe 342 is extended from the bottom panel 314 of the second substrate transfer chamber 304, and is connected to the gas supply pipe 322 connected to the upper panel 316 of the second substrate transfer chamber 304. The air pump 344 is installed in the gas circular pipe 342, sucks the purge gas supplied into the second substrate transfer chamber 304 through the gas circular pipe 342, and circulates the sucked purge gas through the gas circular pipe 342. The filtering part 346 is installed in the gas circular pipe 342, and removes the particles and the airborne molecular contaminants contained in the purge gas being circulated. The second flow controller 348 adjusts a flow rate of the purge gas purified by the filtering part 346.

The contamination control unit 340 further includes a gas exhaust pipe 350, an exhaust valve 352, and a gate valve 354. The gas exhaust pipe 350 is connected to the gas circular pipe 342, and exhausts the nitrogen gas circulated by the air pump 344. The exhaust valve 352 is installed in the gas exhaust pipe 350, and opens and closes the gas exhaust pipe 350. The gate valve 354 is installed in the circular pipe 342 between the second substrate transfer chamber 304 and the air pump 344. A relief valve may be used as the exhaust valve 352.

When the flow rate of the circulated purge gas is reduced by operation of the second flow controller 348, pressure in the circular pipe 342 is gradually increased. At that time, the relief valve used as the exhaust valve 352 compares the pressure in the circular pipe 342 with a predetermined pressure, and adjusts the flow rate of the purge gas exhausted through the gas exhaust pipe 350 in accordance with a comparison result. A proportional control valve may instead be used as the exhaust valve 352. In this case, the proportional control valve adjusts the flow rate of the exhausted purge gas in accordance with the pressure in the circular pipe 342. Alternatively, the exhaust valve 342 may be controlled by a control unit (not shown) for adjusting an internal pressure in the second substrate transfer chamber 304.

Although the gas exhaust pipe 350 and the exhaust valve 352 are disposed between the air pump 344 and the filtering part 346, in FIG. 1, various other configurations are possible.

For example, the gas exhaust pipe 350 and the exhaust valve 352 may be disposed between the filtering part 346 and the second flow controller 348.

When the air condition of the interior of the second substrate transfer chamber 304 is changed abruptly, the gate valve 354 is closed. For example, when a side panel of the second substrate transfer chamber 304 is opened for maintaining the substrate transfer module 300, the gate valve 354 is closed so that the purge gas supplied into the second substrate transfer chamber 304 is exhausted through an open portion of the second substrate transfer chamber 304. Accordingly, external air cannot flow into the second substrate transfer chamber 304, thereby preventing contamination of the semiconductor substrates 10 by external air. Furthermore, external air is prevented from flowing into the air pump 344 and the filtering part 346 through the gas circular pipe 342.

The filtering part 346 for removing impurities contained in the purge gas, which is being circulated through the circular pipe 342, preferably includes a first particle filter 356 for removing the particles, a moisture purifier 358 for removing moisture, and an organic contaminant filter 360 for removing organic contaminants such as a volatile organic compound (VOC).

A high efficiency particulate air (HEPA) filter or an ultra low penetration air (ULPA) filter may be used as the first particle filter 356, and an activated carbon filter may be used as the organic contaminant filter 360. A pair of molecular sieve moisture purifiers 358a and 358b may be used as the moisture purifier 358.

As shown in FIG. 1, the pair of molecular sieve moisture purifiers 358a and 358b is disposed between the first particle filter 356 and the organic contaminant filter 360, and is connected in parallel to the gas circular pipe 342 through a pair of three-way valves 362. When a first molecular sieve moisture purifier 358a is connected to the gas circular pipe 342, a second molecular sieve moisture purifier 358b is restored. In contrast, the first molecular sieve moisture purifier 358a is restored while the second molecular sieve moisture purifier 358b is connected to the gas circular pipe 342.

The interior of the second substrate transfer chamber 304 may be divided into an upper area 304a connected with the gas supply pipe 322, a lower area 304c connected with the gas circular pipe 342, and a substrate handling area 304b for transferring the semiconductor substrates 10 between the upper area 304a and the lower area 304c.

The upper area 304a and the substrate handling area 304b are divided by a second particle filter 370, and the substrate handling area 304b and the lower area 304c are divided by a perforated panel 372. A HEPA filter or an ULPA filter may be used as the second particle filter 370.

A distribution panel 374 is disposed in the upper area 304a defined between the upper panel 316 of the second substrate transfer chamber 304 and the second particle filter 370, and has a plurality of holes 374a. The distribution panel 374 uniformly provides the purge gas supplied from the gas supply unit 320 and the purge gas circulated through the gas circular pipe 342 into the substrate handling area 304b.

The purge gas supplied into the second substrate transfer chamber 304 is dried by the gas purifier 330 of the gas supply unit 320 and the moisture purifier 358 of the contamination control unit 340. An ionizer 376 is disposed between the distribution panel 374 and the second particle filter 370. The ionizer 376 removes static electricity from the semiconductor substrate 10 due to the dried purge gas.

The second substrate transfer robot 306 is disposed in the substrate handling area 304b. As shown in FIG. 1, the distribution panel 374 forms a flow of the purge gas supplied through the gas supply pipe 322 into a laminar flow, and the perforated panel 372 assists function of the distribution panel 374. The perforated panel 372 has a plurality of holes 372a similar to those of the distribution panel 374. Accordingly, the second substrate transfer robot 306 can stably transfer the semiconductor substrate 10.

In FIG. 1, arrows represent the laminar flow of the purge gas in the second substrate transfer chamber 304, and reference designator 380 indicates a differential pressure sensor for measuring a differential pressure between an internal pressure and an external pressure of the second substrate transfer chamber 304.

Figure 3:
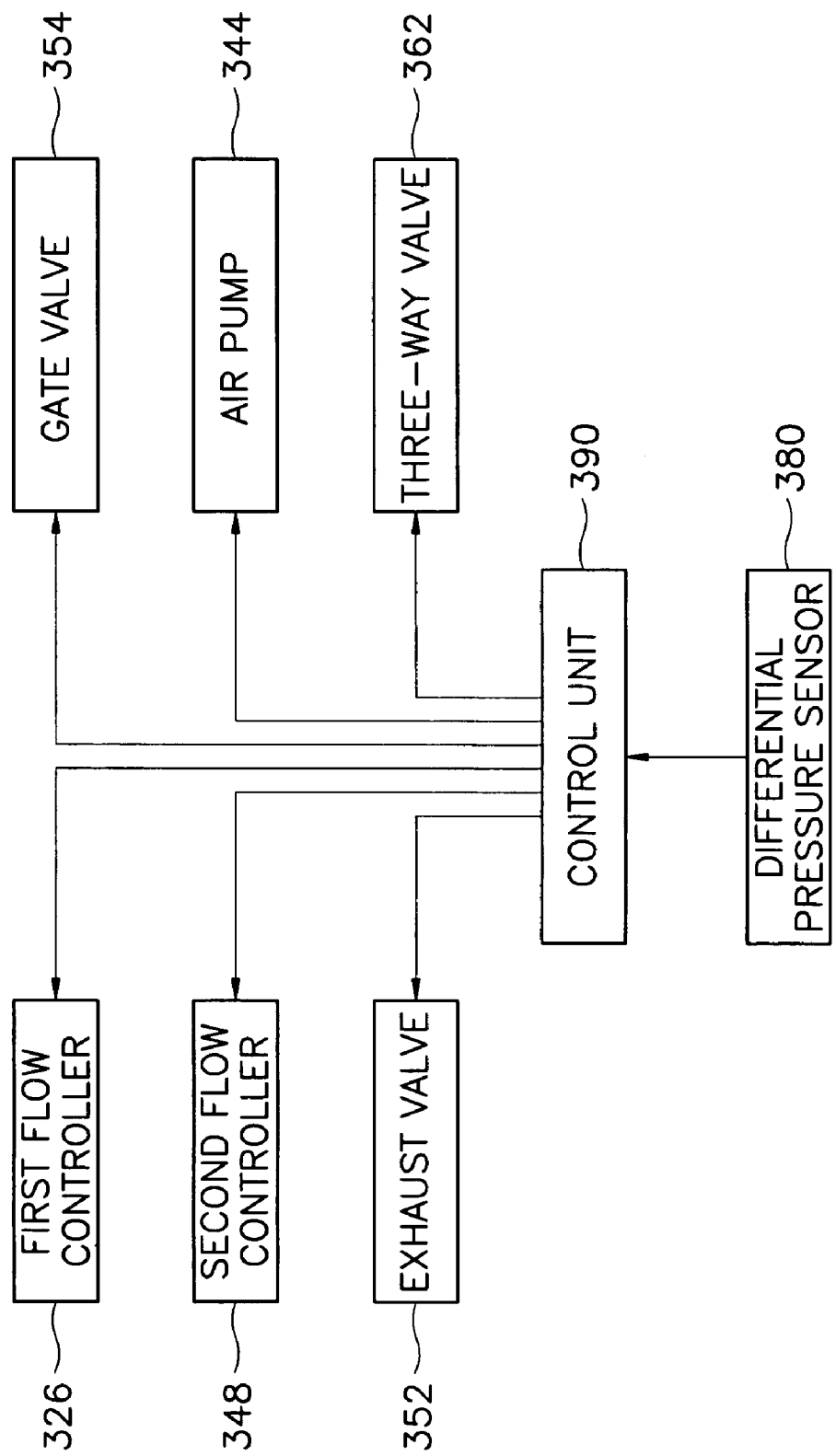
FIG. 3 is a block diagram illustrating operation of the substrate transfer module as shown in FIG. 1.

FIG. 3 is a block diagram illustrating operation of the substrate transfer module as shown in FIG. 1.

Referring to FIGS. 1 and 3, the differential pressure sensor 380 is connected to a control unit 390. The elements already described in connection with the substrate transfer module 300 shown in FIG. 1 are also connected to the control unit 390.

The differential pressure sensor 380 measures the differential pressure between the internal pressure and the external pressure of the second substrate transfer chamber 304, and sends the measured differential pressure to the control unit 390. The control unit 390 compares the measured differential pressure with a predetermined differential pressure, and controls operations of the first and second flow controllers 326 and 348 in accordance with a comparison result. For example, when the door 22 of the FOUP 20 is opened by the door opener 310, the control unit 390 increases the flow rate of the purge gas from the gas supply unit 320 and decreases the flow rate of the purge gas circulated through the gas circular pipe 342. The purge gas supplied from the gas supply unit 320 purges an interior of the FOUP 20, and air inside the FOUP 20 is exhausted through the gas exhaust pipe 350 and the exhaust valve 352. Accordingly, the differential pressure is evenly maintained at the predetermined differential pressure.

The control unit 390 may suitably control an operation of the exhaust valve 352 installed in the gas exhaust pipe 350. That is, the control unit 390 preferably adjusts the flow rate of purge gas exhausted through the gas exhaust pipe 350. For example, the control unit 390 suitably controls the operations of the exhaust valve 352 and the second flow controller 348, thereby adjusting the purge gas being circulated through the circular pipe 342.

In addition, the control unit 390 suitably controls operations of the air pump 344 and the gate valve 354, thereby adjusting the flow rate of the circulated purge gas. For example, when the side panel of the second substrate transfer chamber 304 is opened for maintenance of the substrate transfer module 300, the control unit 390 closes the gate valve 354, stops the operation of the air pump 344 and then increases the flow rate of purge gas being supplied from the gas supply unit 320. As a result, the purge gas supplied into the second substrate 304 is exhausted through the open portion of the second substrate transfer chamber 304, and external air cannot flow into the second substrate transfer chamber 304.

Furthermore, the control unit 390 suitably controls operations of the pair of three-way valves 362 such that each of the pair of three-way valves is alternately connected with the gas circular pipe 342.

Figure 4:
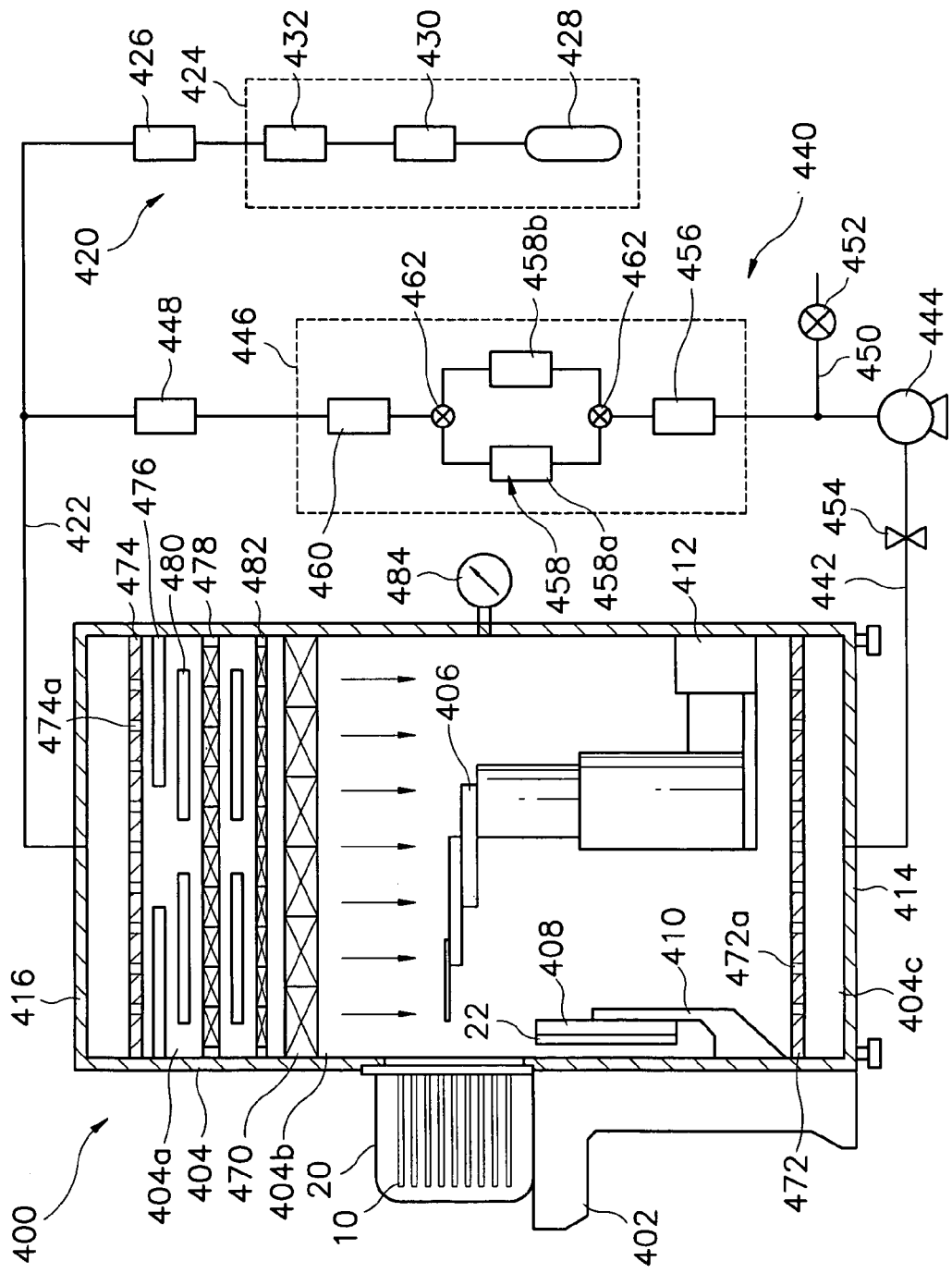
FIG. 4 illustrates a cross-sectional view of a module for transferring a substrate according to another embodiment of the present invention.

FIG. 4 illustrates a cross-sectional view of a module for transferring a substrate according to another embodiment of the present invention.

Referring to FIG. 4, a substrate transfer module 400 preferably includes a load port 402 for supporting a FOUP 20, a substrate transfer chamber 404 disposed between the load port 402 and a load lock chamber (referring to FIG. 2), a substrate transfer robot 406 for transferring semiconductor substrates 10 between the FOUP 20 and the load lock chamber, a door opener 410 for opening and closing a door 22 of the FOUP 20, a gas supply unit 420 for supplying purge gas in order to purge an interior of the substrate transfer chamber 404, and a contamination control unit 440 for preventing contamination of the semiconductor substrates 10.

A driving part 412 for moving the second substrate transfer robot 306 horizontally is installed on an inner sidewall of the second substrate transfer chamber 404, and the second substrate transfer robot 406 is connected to the driving part 412.

The gas supply unit 420 is connected to an upper panel 416 of the substrate transfer chamber 404, and preferably includes a gas supply pipe 422 connected to the upper panel 416, a gas source 424 for supplying the purge, and a first flow controller 426 for adjusting a flow rate of the purge gas.

A MFC may be used as the first flow controller 426, and purified air may be used as the purge gas.

The gas source 424 preferably includes a storage container 428 for storing compressed air and a purifier for removing impurities contained in the air being supplied from the storage container. The purifier preferably includes a first purifier 430 for primarily purifying the air and a second purifier 432 for secondarily purifying the primarily purified air.

The first purifier 430 removes water $H_2O$ and carbon dioxide $CO_2$ contained in the air being supplied from the storage container 428, and the second purifier 432 removes water $H_2O$, carbon monoxide CO, sulfur oxides SOx, nitrogen oxides NOx or the like contained in the primarily purified air. A molecular sieve purifier and a catalytic purifier may be used as the first and second purifiers 430 and 432, respectively.

The contamination control unit 440 is connected to the substrate transfer chamber 404, circulates the air supplied into the substrate transfer chamber 404, and then resupplies the circulated air into the substrate transfer chamber 404. Also, the contamination control unit 440 removes particles and airborne molecular contaminants contained in the air being circulated.

The contamination control unit 440 preferably includes a gas circular pipe 442, an air pump 444, a filtering part 446, and a second flow controller 448. The gas circular pipe 442 is extended from a bottom panel 414 of the substrate transfer chamber 404, and is connected to the gas supply pipe 422 connected to the upper panel 416 of the substrate transfer chamber 404. The air pump 444 is installed in the gas circular pipe 442, sucks the air supplied into the substrate transfer chamber 404 through the gas circular pipe 442, and circulates the sucked air through the gas circular pipe 442. The filtering part 446 is installed in the gas circular pipe 442, and removes particles and airborne molecular contaminants contained the air being circulated. The second flow controller 448 adjusts a flow rate of the air purified by the filtering part 446.

The contamination control unit 440 further includes a gas exhaust pipe 450, an exhaust valve 452 and a gate valve 454.

The gas exhaust pipe 450 is connected to the gas circular pipe 442, and exhausts the air circulated by the air pump 444. The exhaust valve 452 is installed in the gas exhaust pipe 450, and the gate valve 454 is installed in the circular pipe 442 between the second substrate transfer chamber 404 and the air pump 444.

The filtering part 446 for the impurities contained in the air being circulated through the circular pipe 442 preferably includes a first particle filter 456 for removing the particles, a moisture purifier 458 for removing moisture, and an organic contaminant filter 460 for removing organic contaminants such as a volatile organic compound (VOC).

A HEPA filter or an ULPA filter may be used as the first particle filter 456, and an activated carbon filter may be used as the organic contaminant filter 460. A pair of molecular sieve moisture 458a and 458b may be used as the moisture purifier 458.

As shown in FIG. 4, the pair of molecular sieve moisture purifiers 458a and 458b is disposed between the first particle filter 456 and the organic contaminant filter 460, and is connected in parallel to the circular pipe 442 through a pair of three-way valves 462.

The interior of the substrate transfer chamber 404 may be divided into an upper area 404a, a substrate handling area 404b and a lower area 404c.

A distribution panel 474 having a plurality of holes 474a is disposed in the upper area 404a. The distribution panel 474 uniformly provides the air supplied from the gas supply unit 420 and the air circulated through the gas circular pipe 442 into the substrate handling area 404b.

An ionizer 476 is disposed between the distribution panel 474 and a second particle filter 470. The ionizer 476 removes static electricity from the semiconductor substrate 10 due to the dry air supplied into the substrate transfer chamber 404.

A photo catalyst filter 478 for removing organic contaminants and an ultraviolet lamp 480 for applying ultraviolet rays onto the photo catalyst filter 478 are disposed between the ionizer 476 and the second particle filter 470. An aluminum Al mesh coated with titanium dioxide $TiO_2$ may be used as the photo catalyst filter 478, and it is preferable that the ultraviolet rays irradiated from the ultraviolet lamp 480 have a wavelength of 254 nm or longer.

The ionizer 476 and the photo catalyst filter 478 cause ozone to generate from the air supplied through the gas supply pipe 422. The ozone may be removed by means of an ozone filter 482 disposed between the photo catalyst filter 478 and the second particle filter 470.

The substrate transfer robot 406 is disposed in the substrate handling area 404b. The distribution panel 474 forms a flow of the air supplied through the gas supply pipe 422 into a laminar flow, and a perforated panel 472 assists function of the distribution panel 474. The perforated panel 472 has a plurality of holes 472a similar to those of the distribution panel 474. Accordingly, the substrate transfer robot 406 can stably transfer the semiconductor substrate 10.

In FIG. 4, arrows represent the laminar flow of the air in the substrate transfer chamber 404, and the reference designators 408 and 484 indicate a door of the substrate transfer chamber 404 and a differential pressure sensor for measuring a differential pressure between an internal pressure and an external pressure of the second substrate transfer chamber 404, respectively.

Although not shown in figure, a control unit controls operations of the elements of the substrate transfer module 400, based on the differential pressure measured by the differential pressure sensor 484.

Further detailed descriptions of these elements will be omitted because these elements are similar to those already described in connection with the substrate transfer module 300 shown in FIGS. 1 and 2.

According to certain embodiments of the present invention, the purge gas supplied from the gas supply unit purges the interior of the substrate transfer chamber. The contamination control unit circulates and purifies the purge gas supplied into the substrate transfer chamber, and then resupplies the circulated/purified purge gas into the substrate transfer chamber.

Accordingly, external air cannot flow into the substrate transfer chamber, thereby preventing contamination of the semiconductor substrate due to impurities contained in the external air. Furthermore, circulation of the purge gas reduces an amount of purge gas to be supplied from a source.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A module for transferring a substrate comprising:
   a load port for supporting a container to receive a plurality of substrates;
   a substrate transfer chamber disposed between the load port and a substrate process module for processing the substrates;
   a substrate transfer robot disposed in the substrate transfer chamber for transferring the substrates between the container and the substrate process module;
   a gas supply unit connected to the substrate transfer chamber for supplying a purge gas into the substrate transfer chamber so as to purge an interior of the substrate transfer chamber; and
   a contamination control unit connected to the substrate transfer chamber for circulating the purge gas supplied into the substrate transfer chamber, resupplying the circulated purge gas into the substrate transfer chamber and removing particles and airborne molecular contaminants from the purge gas being circulated.

2. The module as claimed in claim 1, wherein the container includes a front opening unified pod (FOUP).

3. The module as claimed in claim 2, further comprising a door opener for opening and closing a door of the FOUP.

4. The module as claimed in claim 1, wherein the gas supply unit includes:
   a gas source for providing the purge gas;
   a gas supply pipe for connecting the gas source and the substrate transfer chamber; and
   a flow controller installed in the gas supply pipe for adjusting a flow rate of the purge gas being supplied into the substrate transfer chamber.

5. The module as claimed in claim 4, wherein the purge gas includes a nitrogen gas, and the gas source includes a storage container for storing the nitrogen gas and a purifier for purifying the nitrogen gas.

6. The module as claimed in claim 4, wherein the purge gas includes air, and the gas source includes a storage container for storing compressed air and a purifier for removing impurities contained in the air being supplied from the storage container.

7. The module as claimed in claim 6, wherein the purifier includes a molecular sieve purifier or a catalytic purifier.

8. The module as claimed in claim 1, wherein the contamination control unit includes:
   a gas circular pipe connecting an upper portion and a lower portion of the substrate transfer chamber;
   an air pump installed in the gas circular pipe for sucking the purge gas supplied into the substrate transfer chamber and circulating the sucked purge gas through the gas circular pipe;
   a filtering part installed in the gas circular pipe for removing the particles and the airborne molecular contaminants contained in the purge gas being circulated; and
   a flow controller installed in the gas circular pipe for controlling a flow rate of the purge gas being circulated.

9. The module as claimed in claim 8, wherein the contamination control unit further includes a gas exhaust pipe connected to the gas circular pipe for exhausting the purge gas being circulated and a valve installed in the gas exhaust pipe for opening and closing the gas exhaust pipe.

10. The module as claimed in claim 8, wherein the contamination control unit further includes a valve installed in the gas circular pipe between the lower portion of the substrate transfer chamber and the air pump for opening and closing the gas circular pipe.

11. The module as claimed in claim 8, wherein the filtering part includes:
    a particle filter for removing the particles contained in the purge gas being circulated;
    a moisture purifier for removing moisture contained in the purge gas being circulated; and
    an organic contaminant filter for removing organic contaminants contained in the purge gas being circulated.

12. The module as claimed in claim 11, wherein the moisture purifier is a molecular sieve moisture purifier.

13. The module as claimed in claim 11, wherein the organic contaminant filter is an activated carbon filter.

14. The module as claimed in claim 1, further comprising:
    a distribution panel horizontally disposed in the substrate transfer chamber, the distribution panel having a plurality of holes for uniformly supplying the purge gas into the substrate transfer chamber; and
    a particle filter disposed between the distribution panel and the substrate transfer robot for removing particles contained in the purge gas being supplied through the holes of the distribution panel.

15. The module as claimed in claim 14, further comprising an ionizer disposed between the distribution panel and the particle filter for removing static electricity from the substrates.

16. The module as claimed in claim 14, wherein the purge gas is an inert gas.

17. The module as claimed in claim 16, wherein the inert gas is a nitrogen gas.

18. The module as claimed in claim 14, wherein the purge gas is purified air.

19. The module as claimed in claim 18, further comprising:
    a photo catalyst filter disposed between the distribution panel and the particle filter for removing organic contaminants contained in the purge gas being supplied into the substrate transfer chamber; and
    an ultraviolet lamp for applying ultraviolet rays onto the photo catalyst filter.

20. The module as claimed in claim 19, further comprising an ozone filter disposed between the photo catalyst filter and the particle filter for removing ozone contained in the purge gas being supplied into the substrate transfer chamber.

21. The module as claimed in claim 1, further comprising:
a differential pressure sensor connected to the substrate transfer chamber for measuring a differential pressure between an internal pressure and an external pressure of the substrate transfer chamber; and
a control unit for comparing the differential pressure measured by the differential pressure sensor with a predetermined differential pressure, and for adjusting a flow rate of the purge gas being supplied into the substrate transfer chamber and a flow rate of the purge gas being circulated through the contamination control unit in accordance with a comparison result.

22. The module as claimed in claim 1, further comprising a perforated panel disposed above a bottom panel of the substrate transfer chamber for passing the purge gas supplied into the substrate transfer chamber therethrough, wherein the perforated panel has a plurality of holes, and the contamination control unit is connected to the bottom panel of the substrate transfer chamber.

* * * * *